United States Patent [19]

Itoh

[11] Patent Number: 4,817,558
[45] Date of Patent: Apr. 4, 1989

[54] THIN-FILM DEPOSITING APPARATUS
[75] Inventor: Hitoshi Itoh, Tokyo, Japan
[73] Assignee: Kabushiki Kaisha Toshiba, Kawasaki, Japan
[21] Appl. No.: 72,143
[22] Filed: Jul. 10, 1987
[30] Foreign Application Priority Data Jul. 10, 1986 [JP] Japan .................................. 60-162283

[51] Int. Cl.$^4$ .............................................. C23C 16/00
[52] U.S. Cl. ..................................... 118/725; 118/715; 118/724
[58] Field of Search ......................... 118/715, 725, 724
[56] References Cited

U.S. PATENT DOCUMENTS 3,845,738 11/1974 Berkman .............................. 118/715
4,503,807 3/1985 Nakayama ........................... 118/719

OTHER PUBLICATIONS

"Kinetics and Mechanism of Selective Tungsten Deposition by LPCVD," Y. Pauleau and Ph. Lami, J. Electrochem. Soc., 132, 2779, (1985).

Primary Examiner—Richard Bueker
Attorney, Agent, or Firm—Oblon, Fisher, Spivak, McClelland & Maier

[57] ABSTRACT

A thin-film depositing apparatus which includes a reaction container adapted to receive a material gas therein, for a thin-film depositing reaction, a substrate supporting member located in a predetermined position in the reaction container in order to set a substrate on which a thin film is to be deposited, heating mechanism for heating the substrate supporting member to deposit the thin film, while heating the substrate, and a cover member covering, in a contacting or noncontacting manner, the whole surface of the substrate supporting member except a substrate bearing surface on which the substrate is to be set. The surface temperature of the cover member is kept lower than that of the substrate, so that an undesired film is restrained from being deposited on the surface of the cover member. Thus, a thin film of good quality can be deposited on the substrate surface with high efficiency.

13 Claims, 4 Drawing Sheets

THIN-FILM DEPOSITING APPARATUS

BACKGROUND OF THE INVENTION

1. Field of the Invention

The present invention relates to an apparatus for depositing a thin film by chemical vapor deposition (hereinafter referred to as CVD), and more particularly, to an apparatus for depositing a thin film while heating a substrate on which the film is to be deposited. More specifically, the present invention relates to a thin-film depositing apparatus adapted for the selective CVD process.

2. Description of the Prior Art

The CVD process is one of the thin-film depositing methods that are used for the manufacture of semiconductor integrated circuits. This process is used, for example, to deposit a thin film of polycrystalline silicon from silane ($SiH_4$) as a material gas, or a thin film of silicon dioxide from organosilane. Recently, the CVD process has been tried as a method for depositing an aluminum film from organoaluminum compound, or thin films of refractory metal and/or silicide thereof from halides of refractory metal.

The CVD process is effected by two methods; an atmospheric-pressure CVD method, in which a thin film is deposited under atmospheric pressure, and a low-pressure CVD method (hereinafter referred to as LPCVD) in which a thin film is deposited under reduced pressure. Presently, the LPCVD is preferred, since it is higher in productivity, and ensures a higher uniformity of film quality and a better step-coverage.

A batch system has conventionally been used in the thin-film deposition by the CVD process. According to this system, a thin film is deposited on a number of substrates at a time. If the surface of each substrate has a micro-structure, however, the batch system is liable to cause variations in the thickness of film on the individual substrates, sometimes entailing insufficient coverage. Thereupon, a "one wafer type" system has been proposed to counter such an awkward situation. According to this system, substrates are fed one by one into a reaction chamber for thin-film formation. In a CVD apparatus based on the "one wafer type" system, however, the thin-film deposition is performed while heating each substrate placed on a susceptor, in order to accelerate a filming reaction on the substrate surface. This entails the following problems.

In the first place, the susceptor, supporting the substrate, and that portion of a reaction container situated close to the substrate are heated to high temperature, so that a thin film is deposited not only on the surface of the substrate, but also on the surfaces of the heated portions of the apparatus. This indicates a waste of the material gas or the film deposition. Thus, costs are increased, and the rate of film deposition on the substrate surface is lowered.

Secondly, the thin film, deposited on the surface of the susceptor or the like in the aforesaid manner, grows with every cycle of filming operation. Ultimately, therefore, the film is separated from the susceptor surface, and adheres, in the deposit of dust, to the substrate surface during the thin-film deposition. Such adhesion of dust deteriorates the properties of the thin film on the substrate. In manufacturing semiconductor integrated circuits, this results in a fatal defect in the circuits, thus lowering the yield considerably. This problem often arises especially when the selective CVD process is used.

Thirdly, if a film is deposited on any other region than the substrate surface, a large amount of reaction byproduct arises in a reaction chamber. As a result, reactive gas in the vicinity of the substrate surface is complicated in composition, so that it becomes difficult to control the CVD process and the quality of the resulting thin film. This problem also arises frequently from the selective CVD. In the selective CVD process, moreover, its selectivity is deteriorated by the reaction by-product, so a film may be deposited on an undesired portion of the substrate surface.

The above problem is especially conspicuous when the LPCVD is used. The reason is that, in the LPCVD, the pressure between a substrate, on which a thin film is to be deposited, and a susceptor, carrying the substrate thereon, is reduced. Thus, the efficiency of thermal transfer between the susceptor and the substrate becomes so low that heat cannot be transferred easily from the susceptor to the substrate. As a consequence, the surface temperature of the susceptor becomes higher than that of the substrate, so that a film is liable to be formed on the susceptor surface.

SUMMARY OF THE INVENTION

A first object of the present invention is to provide a thin-film depositing apparatus, in which a substrate, on which a thin film is to be deposited, is heated to accelerate thin-film deposition, and in which a depositing reaction is restrained from taking place on the surface of any other member than the substrate, e.g., a substrate supporting member, such as a susceptor, so that a thin film of good quality can be deposited on the surface of the substrate with high efficiency.

A second object of the invention is to provide a thin-film depositing method capable of improving the selectivity of thin-film deposition by the selective CVD process.

The first object of the invention is achieved by a thin-film depositing apparatus which comprises a reaction container adapted to receive a material gas therein, for a thin-film depositing reaction, a substrate supporting member located in a predetermined position in the reaction container in order to set a substrate on which a thin film is to be deposited, heating means for heating the substrate supporting member to deposit the thin film, while heating the substrate, and a cover member covering, in a contacting or noncontacting manner, the whole surface of the substrate supporting member except a substrate bearing surface on which the substrate is to be set.

The second object of the invention is achieved by a thin-film depositing method using a thin-film depositing apparatus which comprises a reaction container adapted to receive a material gas therein, for a thin-film depositing reaction, a substrate supporting member located in a predetermined position in the reaction container in order to set a substrate on which a thin film is to be deposited, heating means for heating the substrate supporting member to deposit the thin film, while heating the substrate, and a cover member covering, in a contacting or noncontacting manner, the whole surface of the substrate supporting member except a substrate bearing surface on which the substrate is to be set, the method comprising depositing the thin film on the substrate placed on the substrate supporting member, the substrate having a predetermined surface region which accelerate the thin-film depositing reaction of the material gas, so that the thin film is selectively deposited only on the predetermined surface region of the substrate.

According to the present invention, the rate of heat transfer between the substrate supporting member and the cover member, which covers part of the surface of the supporting member, is very low, although the two members are in contact with each other. Accordingly, the surface temperature of the cover member is lower than that of the substrate supporting member, and can be made lower than that of the substrate by suitably selecting conditions.

Thus, a film can be restrained from being deposited on the surface of any other member than the substrate, such as the substrate supporting member or the inner wall of the reaction container, situated in the vicinity of the substrate. As a consequence, the various problems arising by the use of the conventional apparatus can be overcome.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
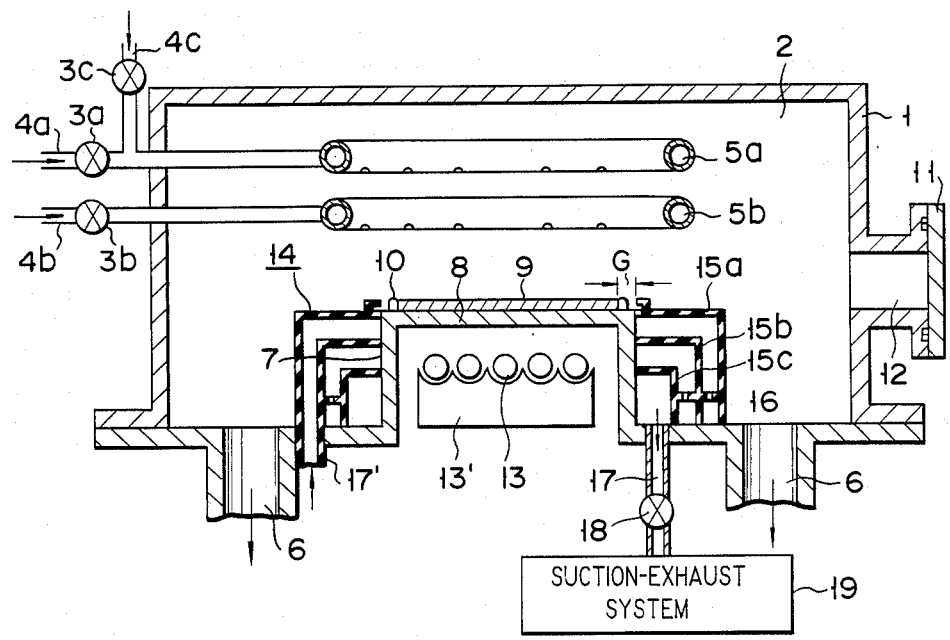
FIG. 1 is a sectional view showing a thin-film depositing apparatus according to a first embodiment of the present invention.

The apparatus of the embodiment of FIG. 1 is constructed as a LPCVD apparatus of a leaf-by-leaf type.

In FIG. 1, numeral 1 designates a reaction container which is made of metal, such as stainless steel. Defined inside container 1 is reaction chamber 2 in which a thin film is deposited by LPCVD. Reaction-gas supply pipes 4a, 4b and 4c are led from the outside of container 1 into chamber 2. Pipe 4c joins pipe 4a outside reaction chamber 2. Pipes 4a, 4b and 4c have valves 3a, 3b and 3c, respectively, which are located outside container 1. Ring-shaped nozzles 5a and 5b are coupled to those ends of pipes 4a and 4b, respectively, which are situated inside reaction chamber 2. Each nozzle has a number of gas jets facing downward. Exhaust ports 6, which are deposited at the bottom of chamber 2, are connected to an exhaust system (not shown).

Also, substrate supporting member 7 is located at the bottom of reaction chamber 2. It is deposited by projecting the bottom portion of reaction container 1 upwardly, as shown in FIG. 1. Thus, supporting member 7 is generally an inverted bottomed cylinder. Member 7 has flat substrate bearing surface 8, which carries thereon substrate (e.g., silicon wafer) 9 on which the thin film is to be deposited. Positioning pins 10 (three in number, in this embodiment), used to position substrate 9, protrude upwardly from the peripheral edge portion of bearing surface 8. Substrate inlet/outlet port 12 is deposited in the side wall of container 1. Door 11 is attached to port 12. Arranged inside supporting member 7 are infrared lamp 13 and reflector 13', which constitute a heat source for heating substrate 9.

In this embodiment, cover member 14, formed of a material (e.g., quartz) of low thermal conductivity, is provided additionally, covering the whole surface of substrate supporting member 7 except substrate bearing surface 8. Member 14 includes three ring-shaped plates 15a, 15b and 15c, L-shaped in section and having different diameters, and coupling member 16 integrally connecting the ring-shaped plates. Constructed in this manner, cover member 14 has three chambers defined therein, which communicate with one another by means of communication holes (not shown) bored through the ring-shaped plates as partition walls. These chambers are connected to suction-exhaust system 19 by means of pipe 17, which extends from an air hole in the bottom wall of container 1, and valve 18. Also, the chambers inside cover member 14 can be supplied with gas, such as nitrogen or argon gas, through pipe 17'. With this arrangement, the pressure in an internal space surrounded by cover member 14 can be varied independently from the internal pressure of reaction chamber 2, ranging from a reduced pressure to a higher pressure produced by nitrogen or argon gas, for example.

Cover member 14 is located so that the top face of its outermost ring-shaped plate 15a is substantially flush with substrate bearing surface 18 of substrate supporting member 7. During the thin-film deposition, therefore, bearing surface 18 of supporting member 7 is covered by substrate 9, and the other surface portion of member 7 is covered by cover member 14. Thus, the surface of member 7, at high temperature, can be prevented from being exposed directly to an atmosphere for the thin-film deposition. Ring-shaped plate 15a, constituting the outermost part of cover member 14, is located so that its inner edge is not in contact with supporting member 7. Thus, the surface temperature of cover member 14 can be kept lower.

In this embodiment, moreover, the inner edge of outermost ring-shaped plate 15a is lifted up and bent so as to surround substrate 9 on the same level therewith. Gap G between the inner edge of plate 15a and substrate 9 is defined by the relationship $0 < G \leq 1$ mm. Such an arrangement is intended not only to make the surface temperature of cover member 14 lower than the temperature of substrate 9, but also to prevent the material gas from flowing behind the substrate and thereby depositing a film on the reverse side of the substrate. Thus, with this arrangement, the material gas on the point of flowing behind substrate 9 touches and reacts with the lateral faces of the substrate, which are exposed to gap G, thereby depositing a thin film on the lateral faces. Accordingly, the reactive gas is trapped on the lateral faces, thereby preventing a film from being deposited on the reverse side of substrate 9. Gap G is restricted to a width of 1 mm or less because if it is wider than 1 mm, the trapping effect is not sufficient to prevent the deposition of a film on the reverse side of substrate 9.

There will now be described a method for selectively depositing a thin film of tungsten on a predetermined surface region of a silicon wafer, by using the apparatus of the aforementioned embodiment.

Before depositing the thin film, reaction chamber 2 is first evacuated through exhaust ports 6,6 and suction-exhaust system 19 is operated to evacuate the inside of cover member 14. Then, valve 4c is opened to supply argon gas through nozzle 5a, at a flow rate of 500 cc/min, whereby the pressure inside chamber 2 is adjusted to 10 Torr. At the same time, argon gas is supplied through pipe 17', at a flow rate of 50 cc/min, thereby adjusting the pressure in the internal space of the cover member to 15 Torr. In this state, infrared lamp 13 is turned on. Thereupon, substrate supporting member 7 is heated directly, so that substrate 9, receiving heat from member 7, is heated. Since the internal pressure (15 Torr) of cover member 14 is higher than that (10 Torr) of the reaction chamber, the heat from supporting member 7 is transmitted more effectively to member 14 than to substrate 9. As a result, the temperature of member 14 becomes higher than that of substrate 9. Thus, subjected to radiant heat from the cover member, substrate 9 is heated more quickly to a predetermined temperature (e.g., about 400° C.).

After preparations for a CVD reaction are made in the aforesaid manner, thin-film deposition is performed as follows. Valve 3c is closed to stop the supply of argon gas, and valves 3a and 3b are then opened, so that $WF_6$ gas and hydrogen gas are introduced from pipes 4a and 4b, respectively, into reaction chamber 2, under pressures ranging from 0.1 to 5 Torr and from 0.5 to 10 Torr, respectively. The $WF_6$ and hydrogen gases, introduced in this manner, are jetted into chamber 2 through ring-shaped nozzles 5a and 5b, respectively. At the same time, suction-exhaust system 19 is actuated to decompress the internal space of cover member 14 to a reduced pressure (e.g., 1 m Torr or less). If the internal pressure is thus reduced to 1 m Torr or less, the amount of heat transferred from substrate supporting member 7 to cover member 14 is reduced considerably. Thus, the surface temperature of member 14 is kept at a temperature lower enough than that (about 700° C.) of substrate 9. In this embodiment, in particular, cover member 14 has a triple structure, so that the surface of outermost ring-shaped plate 15a is kept more effectively at low temperature than in the case where ring-shaped plates 15b and 15c are not provided inside plate 15a. Since the heat transfer to cover member 14 is suppressed, supporting member 7 is heated to a higher temperature, thereby ensuring effective heat transfer to substrate 9.

Figure 2:
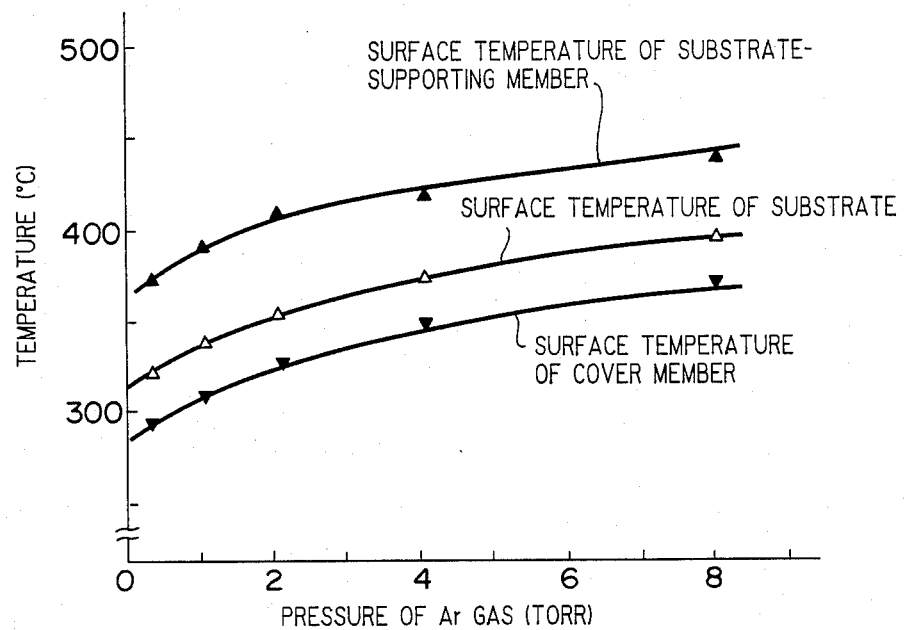
FIG. 2 is a graph illustrating the function of a cover member used in the apparatus of FIG. 1.

The effect of the cover member will now be described more specifically. FIG. 2 illustrates the respective surface temperatures of substrate supporting member 7 (stainless steel), substrate 9 (silicon wafer), and cover member 14 (quartz), obtained while varying the argon-gas pressure inside the cover member. Irrespectively of the internal pressure, as shown in FIG. 2, the surface temperature of member 14 is kept lower than that of substrate 9. These data are obtained with use of an arrangement such that cover member 14 is formed only of ring-shaped plate 15a. The first embodiment, using the triple-structure cover member, can be expected to produce better results.

Thus, if the selective CVD reaction is made using $WF_6$ and hydrogen, with the surface temperature of the cover member kept at low temperature, a tungsten film is prevented from being deposited on the surface of any other member than substrate 9. In this manner, the tungsten film can be deposited efficiently on the surface of substrate 9, without wasting the material gas. In stopping the thin-film deposition, valves 3a and 3b are first closed to interrupt the material gas supply, and valve 3c is then opened to allow the argon gas to flow into the reaction chamber, at a flow rate of 500 cc/min. Subsequently, infrared lamp 13 is turned off, and valve 3c is closed to stop the argon gas supply from pipe 17.

An experiment conducted with use of the apparatus of the aforementioned embodiment will now be described. In this experiment, a thin film of tungsten was deposited selectively on the exposed surface of a silicon substrate which was partially covered with a silicon oxide film by the aforesaid steps of procedure. In this case, the introduction pressures of the $WF_6$ gas and hydrogen gas used were 0.2 Torr and 1 Torr, respectively, and the deposition temperature used was 350° C. As an example for comparison, a thin film of tungsten was deposited selectively under the same conditions as aforesaid, by using a conventional apparatus which has the same construction as the apparatus of FIG. 1 except for the absence of cover member 14.

Figure 3:
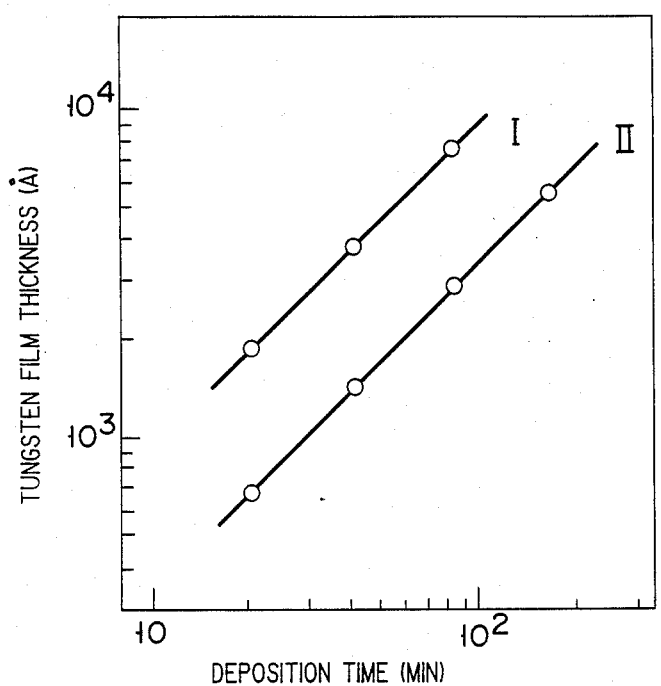
FIG. 3 is a graph showing the deposition rate (curve I) of the apparatus of FIG. 1, used actually to deposit a thin film of tungsten, compared with the rate (curve II) of a prior art apparatus.

First, the relation between the deposition time and the film thickness was examined for the first embodiment and the example for comparison. FIG. 3 shows the results of the examination, in which curves I and II represent the filming characteristics of the apparatuses according to the first embodiment and the example for comparison, respectively. These results indicate that the tungsten-film deposition rate is improved, according to the first embodiment, since only a very small amount of material gas is used wastefully on the surface of the substrate supporting member.

After filming operation, using the apparatuses of the first embodiment and the example for comparison, the two apparatuses are compared for the number of tungsten particles deposited on the silicon oxide film of the wafer. The results are given as follows:

Embodiment: 5 particles/cm$^2$
Example for comparison: $5 \times 10^4$ particles/cm$^2$ These results indicate that the selectivity of film deposition according to the first embodiment is improved. The selectivity is improved due to the fact that selectivity of the selective CVD is lowered by the action of HF which is produced as a reaction byproduct when tungsten is deposited after the reaction between $WF_6$ and hydrogen. More specifically, HF serves to etch the surface of an $SiO_2$ film as follows:

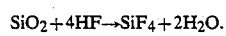

$$SiO_2 + 4HF \rightarrow SiF_4 + 2H_2O.$$

An $SiF_4$ film, which is deposited by this etching reaction, accelerates a reduction of $WF_6$, so that the selectivity of the tungsten-film deposition is lowered. According to the method of the first embodiment, as mentioned before, the tungsten film is prevented from being deposited on undesired portions other than substrate 9, so that the total amount of HF, as a by-product of the filming reaction, is reduced. Accordingly, the deposition of $SiF_4$, which lowers the selectivity of the tungsten film deposition is suppressed, so that the selectivity is higher in the first embodiment than in the example for comparison.

The present invention is not limited to the deposition of the tungsten film, and may also be applied to the deposition of an SiO₂ film, polycrystalline silicon film, etc. When depositing an SiO₂ film, the temperature of substrate 9 is adjusted to 500° to 800° C., for example, and TEOS (tetraethyl orthosilicate) gas and nitrogen gas are supplied at flow rates of 1 to 200 cc/min and 100 to 1,000 cc/min, respectively. When depositing a polycrystalline silicon film, on the other hand, the substrate temperature is adjusted to 800° to 1,100° C., and SiH₄ gas, hydrogen gas, and nitrogen gas are supplied under pressures of 0.1 to 1 Torr, 1 to 10 Torr, and 1 to 100 Torr, respectively. In either case, a thin film of good quality can be deposited with high efficiency if other conditions are arranged in the same manner as in the first embodiment.

A thin-film depositing apparatus according to another embodiment of the present invention will now be described.

Figure 4:
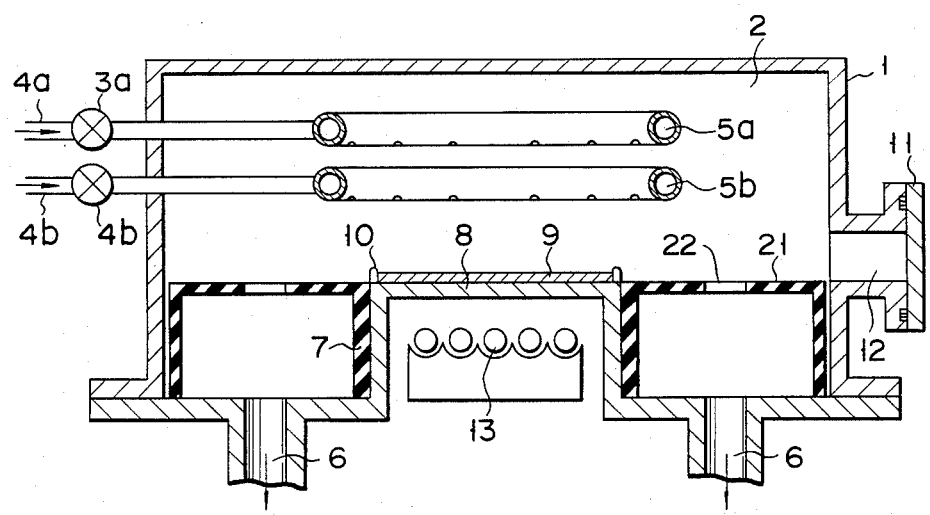
FIG. 4 is a sectional view showing a thin-film depositing apparatus according to a second embodiment of the invention.

FIG. 4 is a sectional view showing the apparatus of the second embodiment. In this embodiment, a suction-exhaust system for the reaction chamber doubles as a suction-exhaust system for the internal space of the cover member. More specifically, cover member 21, U-shaped in cross section, is used in place of cover member 14 of triple structure shown in FIG. 1. The internal space of member 21, surrounded by member 21 and the bottom surface of reaction container 1, communicates with exhaust ports 6 of reaction chamber 2. The top wall of cover member 21 has an aperture portion 22, which is in the form of a continuous ring or a plurality of holes. The internal space of member 21 and chamber 2 communicate with each other by means of portion 22. Cover member 21 and substrate supporting member 7 are in contact with each other, without leaving gap G between them. With respect to the other arrangements, the second embodiment is substantially the same as the first embodiment.

In the embodiment shown in FIG. 4, the moment reaction chamber 2 is exhausted through exhaust ports 6, during the thin-film depositing process, the internal space of cover member 21 is also exhausted. As a result, heat transfer from substrate supporting member 7 to cover member 21 is suppressed, so that the surface temperature of member 21 can be kept lower than that of substrate 9.

Figure 5:
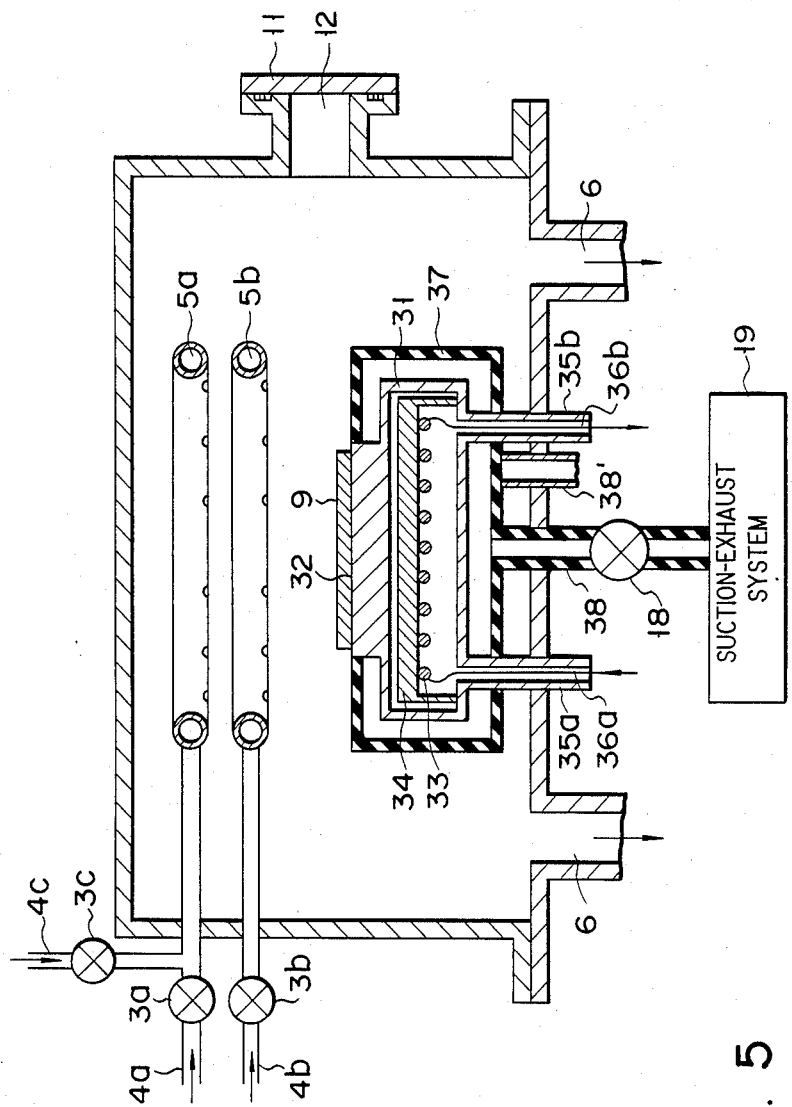
FIG. 5 is a sectional view showing a thin-film depositing apparatus according to a third embodiment of the invention.

FIG. 5 is a sectional view showing a thin-film depositing apparatus according to a third embodiment of the present invention. In this embodiment, sheathed resistance wire 33 is used as a heat source, in place of infrared lamp 13 used in the foregoing embodiments. As shown in FIG. 5, moreover, substrate supporting member 31 is arranged independently of reaction container 1. Supporting member 31 has substrate bearing surface 32. Defined inside member 31 is a space in which is contained the heat source, i.e., incandescent plate 34 with sheathed resistance wire 33 on its lower surface. Plate 34, which is made of metal, such as copper, serves to uniformly transfer heat from wire 33 to supporting member 31. Resistance wire 33 is connected to a heating power source by means of lead wires 36a and 36b, which pass through a pair of pipes 35a and 35b, respectively. Pipes 35a and 35b are coupled to the bottom wall of supporting member 31. Cylindrical cover member 37 covers tee outside of member 31. The top surface of cover member 37 is situated substantially flush with substrate bearing surface 32, and is deposited with an opening through which surface 32 is exposed. Thus, substrate 9 is surrounded by the edge of the opening of member 37 when it is placed on bearing surface 32. Pipe 38 is deposited integrally on the bottom portion of cover member 37. Such communicates with the internal space of member 37, that is, the space between members 37 and 31. Also, pipe 38 is connected to suction-exhaust system 19 via valve 18.

In depositing a thin film by using the apparatus of the embodiment shown in FIG. 5, the internal space of cover member 37 is compressed before filming on the surface of substrate 9, and is decompressed during the film deposition. Thus, the same effect of the embodiment of FIG. 1 can be obtained.

Figure 6:
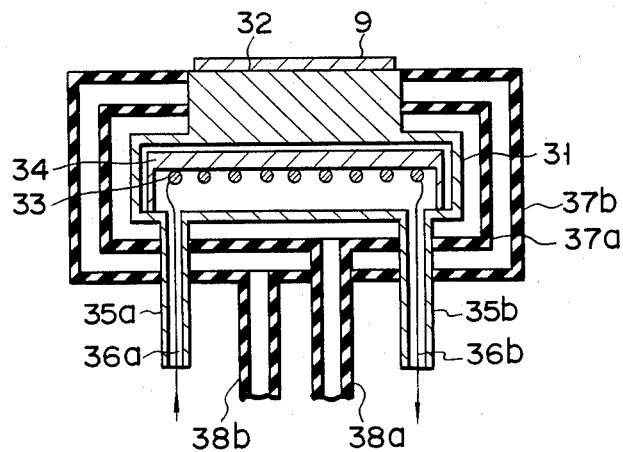
FIG. 6 is a sectional view showing the principal part of a thin-film depositing apparatus according to a fourth embodiment of the invention.

FIG. 6 is a sectional view showing the principal part of a thin-film depositing apparatus according to a fourth embodiment of the present invention. A cover member of this embodiment is a double-structure version of cover member 37 used in the third embodiment of FIG. 5. More specifically, the double-structure cover member is composed of inner or first cover member portion 37a and outer or second cover member portion 37b. The interior of the cover member is divided into two chambers by first portion 37a. The two chambers communicate with each other by means of a through hole (not shown) in portion 37a. Pipes 38a and 38b for suction and exhaust are attached integrally to the bottom portions of first and second cover member portions 37a and 37b, respectively.

Also in the embodiment of FIG. 6, the rate of heat transfer from substrate supporting member 31 to the surface of second cover member portion 37b can be made very low by decompressing the aforesaid two chambers defined by cover member portions 37a and 37b and supporting member 31. Accordingly, the temperature of the surface of the cover member, exposed to the inside of reaction chamber 2, can be kept lower than in the case of the embodiment of FIG. 5. Thus, the effect of the present invention can be augmented.

Figure 7:
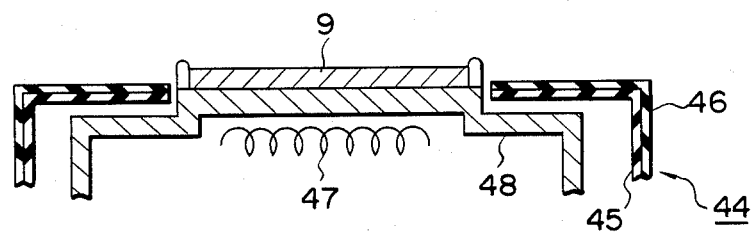
FIG. 7 is a sectional view showing the principal part of a thin-film depositing apparatus according to a fifth embodiment of the invention.

FIG. 7 is a sectional view showing the principal part of a thin-film depositing apparatus according to a fifth embodiment of the present invention. In this embodiment, cover member 44 includes two ring-shaped plates 45 and 46 of quartz, L-shaped in section and pasted on each other. In this case, the thermal conductivity of plates 45 and 46 is low, and the heat conduction resistance at the interface between the plates is high. Therefore, the surface temperature of cover member 44 can be kept low enough, without decompressing the space inside the cover member. Thus, without using any special decompressing means, the surface temperature of inner plate 45 can be 50° C. or more lower than that of substrate supporting member 48. Further, the surface temperature of outer plate 46 can be 50° C. or more lower than that of plate 45. Consequently, filming on the surface of cover member 44 can be prevented effectively, and a thin film of good quality can be deposited efficiently on the surface of substrate 9. Such an arrangement of the cover member of the fifth embodiment may be applied also to any of the embodiments shown in FIGS. 1 to 6.

It is to be understood that the present invention is not limited to the embodiments described above, and that various changes and modifications may be effected therein by one skilled in the art without departing from the scope or spirit of the invention. For example, the surface temperature of the cover member may be kept lower than that of the substrate by introducing a cooling gas, such as cooled nitrogen gas, into the internal space of the cover member, or by feeding a constant-temperature liquid whose temperature is lower than substrate 9 into the space, through a pipe, instead of decompressing the internal space. Alternatively, such temperature maintenance may be achieved by using a Peltier-effect element.

The cover member of the present invention is not limited to the deposit of a plate, and may alternatively be brick-shaped.

Although illustrative embodiments have been described in which a thin film of tungsten is deposited on the surface of a silicon substrate, the present invention may be applied also to deposition of thin films of any other suitable materials, based on the CVD process.

What is claimed is:

1. A thin-film depositing apparatus comprising:
   a reaction container adapted to receive a material gas therein, for a thin-film depositing reaction;
   a substrate supporting member located in a predetermined position in the reaction container in order to set a substrate on which a thin film is to be deposited;
   heating means for heating the substrate supporting member to deposit the thin film, while heating the substrate; and
   a first cover member covering, in a contacting or non-contacting manner, the whole surface of the substrate supporting member except a substrate bearing surface on which the substrate is to be set wherein a space is provided between said first cover member and said substrate supporting member.

2. A thin-film depositing apparatus according to claim 1, further comprising means for introducing a coolant into said space.

3. A thin-film depositing apparatus according to claim 1, further comprising a second cover member wherein said space between the cover member and the substrate supporting member is divided into a plurality of chambers by said second cover member.

4. A thin-film depositing apparatus according to claim 1, further comprising means for keeping said space between the cover member and the substrate supporting member at a pressure lower than the pressure inside the reaction container to which the substrate is exposed.

5. A thin-film depositing apparatus according to claim 1, wherein the thermal conductivity of said cover member is lower than that of said substrate supporting member.

6. A thin-film depositing apparatus according to claim 1, wherein said space between the cover member and the substrate supporting member communicates with the internal space of the reaction container to which the substrate is exposed.

7. A thin-film depositing apparatus according to claim 1, wherein said substrate supporting member is shaped so as to project upwardly from the bottom surface of the reaction container, and said cover member is located so that the top surface thereof is substantially flush with the substrate bearing surface of the substrate supporting member.

8. A thin-film depositing apparatus according to claim 7, wherein the extreme end of said cover member is lifted so as to surround the substrate with a gap of a predetermined width between said extreme end of said cover member and the substrate.

9. A thin-film depositing apparatus according to claim 8, wherein the width of said gap is 1 mm or less.

10. A thin-film depositing apparatus according to claim 1, wherein said heating means comprises an infrared lamp.

11. A thin-film depositing apparatus according to claim 1, wherein said heating means comprises a sheathed resistance wire.

12. A thin-film depositing apparatus according to claim 1, wherein said cover member also covers a portion of the inner surface of the reaction container in the vicinity of the substrate supporting member.

13. A thin-film depositing apparatus according to claim 1, further comprising vacuum means for evacuating the inside of said reaction container.

* * * * *